(12) United States Patent
Koo et al.

(10) Patent No.: US 8,399,306 B2
(45) Date of Patent: Mar. 19, 2013

(54) INTEGRATED CIRCUIT PACKAGING SYSTEM WITH TRANSPARENT ENCAPSULATION AND METHOD OF MANUFACTURE THEREOF

(75) Inventors: JunMo Koo, Singapore (SG); Pandi Chelvam Marimuthu, Singapore (SG); Jae Hun Ku, Singapore (SG); Jose Alvin Caparas, Singapore (SG); Shariff Dzafir, Singapore (SG)

(73) Assignee: Stats Chippac Ltd., Singapore (SG)

( * ) Notice: Subject to any disclaimer, the term of this patent is extended or adjusted under 35 U.S.C. 154(b) by 62 days.

(21) Appl. No.: 13/071,760

(22) Filed: Mar. 25, 2011

(65) Prior Publication Data
US 2012/0241927 A1    Sep. 27, 2012

(51) Int. Cl.
*H01L 21/00* (2006.01)
(52) U.S. Cl. ...................................... 438/127
(58) Field of Classification Search .................. 438/126, 438/127; 257/82, 89
See application file for complete search history.

(56) References Cited

U.S. PATENT DOCUMENTS

| | | | |
|---|---|---|---|
| 6,888,168 B2 * | 5/2005 | Fjelstad | 257/81 |
| 7,494,844 B2 | 2/2009 | Jung et al. | |
| 7,550,680 B2 | 6/2009 | Pendse | |
| 7,553,752 B2 | 6/2009 | Kuan et al. | |
| 7,781,787 B2 * | 8/2010 | Suehiro et al. | 257/98 |
| 2007/0295982 A1 * | 12/2007 | Ryu et al. | 257/99 |
| 2008/0105962 A1 | 5/2008 | Lee et al. | |
| 2010/0065948 A1 | 3/2010 | Bae et al. | |
| 2011/0024887 A1 | 2/2011 | Chi et al. | |

OTHER PUBLICATIONS

U.S. Appl. No. 12/580,933, filed Oct. 16, 2009, Park et al.
U.S. Appl. No. 12/717,335, filed Mar. 4, 2010, Camacho et al.
U.S. Appl. No. 12/612,365, filed Nov. 4, 2009, Choi et al.

* cited by examiner

*Primary Examiner* — Charles Garber
*Assistant Examiner* — Andre' C Stevenson
(74) *Attorney, Agent, or Firm* — Ishimaru & Associates LLP

(57) ABSTRACT

A method of manufacture of an integrated circuit packaging system includes: forming a substrate having a redistribution line thereon; mounting an integrated circuit to the substrate; and molding a transparent encapsulation over the substrate covering the integrated circuit and the redistribution line and the integrated circuit seen through the transparent encapsulation.

18 Claims, 4 Drawing Sheets

INTEGRATED CIRCUIT PACKAGING SYSTEM WITH TRANSPARENT ENCAPSULATION AND METHOD OF MANUFACTURE THEREOF

TECHNICAL FIELD

The present invention relates generally to an integrated circuit packaging system, and more particularly to a system for encapsulation of integrated circuits.

BACKGROUND ART

The electronic industry continues to seek products that are lighter, faster, smaller, multi-functional, more reliable, and more cost-effective. The advent of multi-function electronic devices, such as cell phones that are also game platforms, cameras, Internet portals, and music or video players, has brought immense pressure on the electronics device manufacturers and the manufacturing companies that support them.

In an effort to meet such requirements, package assembly techniques have been developed for smaller packages. These types of packages can combine two or more semiconductor chips in a single package, thereby realizing increased memory density, multi-functionality, and/or reduced package footprint.

Thus, a need still remains for integrated circuit packaging system for increasing integration, decrease size, and increased reliability. In view of the challenges of balancing all these needs, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: forming a substrate having a redistribution line thereon; mounting an integrated circuit to the substrate; and molding a transparent encapsulation over the substrate covering the integrated circuit and the redistribution line and the integrated circuit seen through the transparent encapsulation.

The present invention provides an integrated circuit packaging system, including: a substrate having a redistribution line thereon; an integrated circuit mounted to the substrate; and a transparent encapsulation over the substrate covering the integrated circuit and the redistribution line and the integrated circuit seen through the transparent encapsulation.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
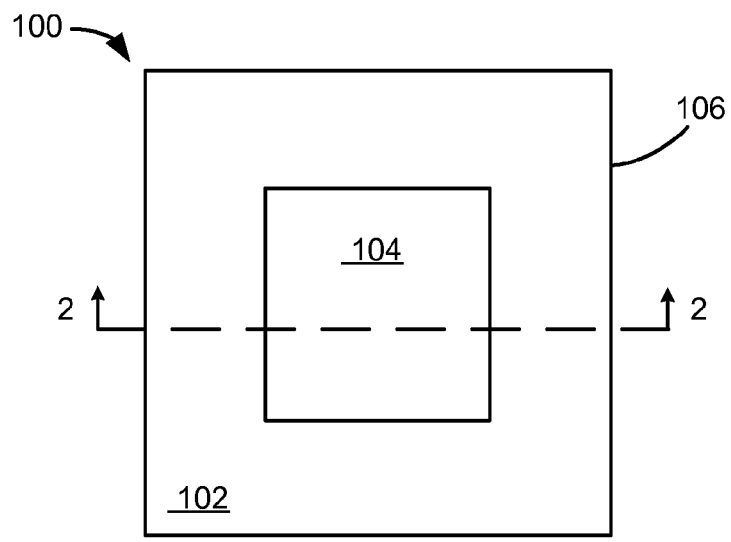
FIG. 1 is a top view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the active side of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact among elements with no intervening element.

The term "processing" as used herein includes deposition of material or photoresist, patterning, exposure, development, etching, cleaning, and/or removal of the material or photoresist as required in forming a described structure.

Referring now to FIG. 1, therein is shown a top view of an integrated circuit packaging system 100 in a first embodiment of the present invention. FIG. 1 depicts a top view and not a top plan view where a transparent encapsulation 102 is shown exposing an integrated circuit 104 mounted to a substrate 106.

The transparent encapsulation 102 is not an opaque encapsulation, such as an epoxy molding compound, and has light transmittance over a range of visible light. More details about the light transmittance are described in FIG. 13 below.

The substrate 106 is an integrated circuit carrier made from lamination process, or a semiconductor or silicon fabrication process. Examples of the substrate 106 are laminated substrate or through-silicon-via substrate. A through-silicon-via substrate is one that is made from a wafer, such as a silicon wafer, and has redistribution layers on either or both horizontal surfaces and conductive vias through the silicon bulk material of the through-silicon-via substrate.

For illustrative purposes, the integrated circuit packaging system 100 is shown in a square geometric configuration, although it is understood that the configuration may be different. For example, the substrate 106 may not be square, such as a rectangular geometric configuration, and the integrated circuit 104 may be mounted offset and not in a central region of the substrate 106.

As a more specific example, the integrated circuit packaging system 100 including the substrate 106 as the through-silicon-via substrate without mold may be damaged during assembly and test. Also, even though mold is used for package on package (PoP) structures using TSV, it is difficult to align due to its opaque mold for the subsequent front side process after molding. Hence, additional align marks should not be needed.

Figure 2:
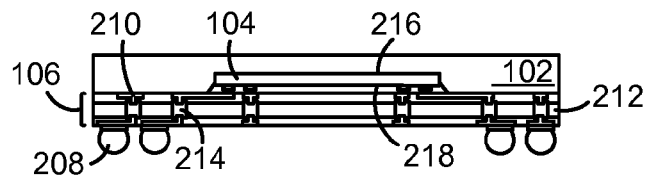
FIG. 2 is a cross-sectional view of the integrated circuit packaging system along line 2-2 of FIG. 1.

Referring now to FIG. 2, therein is shown a cross-sectional view of the integrated circuit packaging system 100 along line 2-2 of FIG. 1. External interconnects 208, which are electrical connector structures for providing electrical connections to the next system level (not shown), can be attached to a bottom of the substrate 106.

For illustrative purposes, although the integrated circuit packaging system 100 is shown with the external interconnects 208 along only at a peripheral region at the bottom side of the substrate 106, it is understood that the integrated circuit packaging system 100 can have the external interconnects 208 in a different configuration. For example, the external interconnects 208 may be only within the central region along the bottom side of the substrate 106 or can fully populate the bottom side of the substrate 106.

The substrate 106 can include contacts 210 and redistribution lines 212 along both horizontal sides of the substrate 106. The contacts 210 provide mechanical and electrical attachment structures to the substrate 106. For example, the external interconnects 208 can attach to the substrate 106 through the contacts 210 at the bottom side of the substrate 106.

The redistribution lines 212 provide conductive connections or traces for the substrate 106. The redistribution lines 212 can be along the horizontal sides of the substrate 106 and can also be within the substrate 106 providing horizontal electrical conduction paths. The redistribution lines 212 can also connect directly to the contacts 210.

The substrate 106 can also include vias 214. The vias 214 are electrical conduction channels that are vertically oriented in the substrate 106. The vias 214 can connect to the contacts 210, the redistribution lines 212, or a combination thereof.

The integrated circuit 104 is an active device having a non-active side 216 and an active side 218 having active circuitry fabricated thereon. As an example, the integrated circuit 104 is shown as a flip chip. The integrated circuit 104 can be other types of active devices, such as wire bonded integrated circuit, a packaged integrated circuit, or a multi-chip package. The integrated circuit 104 is mounted on the substrate 106, as an example.

The transparent encapsulation 102 is over the substrate 106 covering the integrated circuit 104 and the contacts 210 and the redistribution lines 212 along the top side of the substrate 106, as an example. As discussed above, the transparent encapsulation 102 allows the structure of the integrated circuit 104, the contacts 210, the redistribution lines 212, and the substrate 106 to be visible with visible light through the transparent encapsulation 102.

It has been discovered that the present invention provides the integrated circuit packaging system 100 with improved reliability, higher yield, and lower cost. The introduction of the transparent encapsulation 102 allows easy alignment through the transparent encapsulation 102 in subsequent wafer processes and stacking in PoP package as well as protection of the integrated circuit 104 or other components (not shown) mounted on the substrate 106 and at the same time acting as carrier for subsequent backside processing thereby increasing the reliability of the integrated circuit packaging system 100 by preventing damage during manufacturing that also results in increased yield and lower cost. The transparent encapsulation 102 also eliminates the need for temporary bonding/debonding process, which induces cracks or resides on wafer. The transparent encapsulation 102 adds to the mechanical strength of the final device and during handling.

Thus, it has been discovered that the integrated circuit packaging system of the present invention furnishes important and heretofore unknown and unavailable solutions, capabilities, and functional aspects for integrated circuit packaging with increased reliability and yield.

Figure 3:
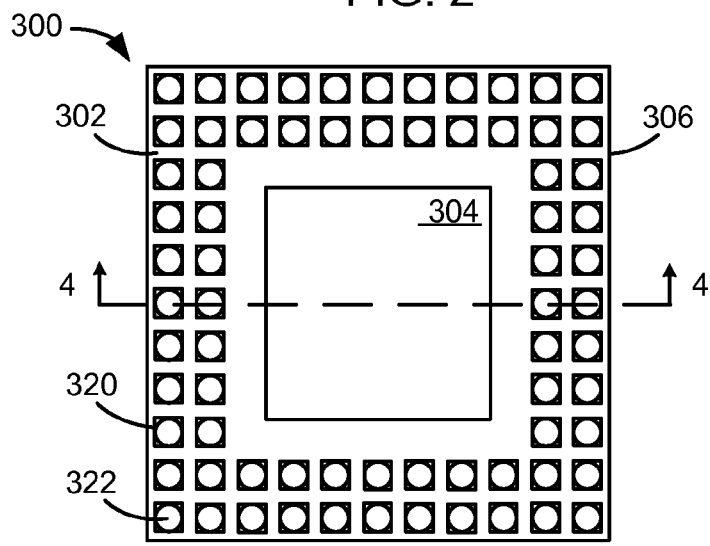
FIG. 3 is a top view of an integrated circuit packaging system in a second embodiment of the present invention.

Referring now to FIG. 3, therein is shown a top view of an integrated circuit packaging system 300 in a second embodiment of the present invention. FIG. 3 depicts a top view and not a top plan view where a transparent encapsulation 302 is shown exposing an integrated circuit 304 mounted to a substrate 306.

The transparent encapsulation 302 is not an opaque encapsulation, such as an epoxy molding compound, and has light transmittance over a range of visible light. More details are about the light transmittance is described in FIG. 13 below.

The substrate 306 is an integrated circuit carrier made from lamination process, or a semiconductor or silicon fabrication process. Examples of the substrate 306 are laminated substrate or through-silicon-via substrate. A through-silicon-via substrate is one that is made from a wafer, such as a silicon wafer, and has redistribution layers on either or both horizontal surfaces and conductive vias through the silicon bulk material of the through-silicon-via substrate.

For illustrative purposes, the integrated circuit packaging system 300 is shown in a square geometric configuration, although it is understood that the configuration may be different. For example, the substrate 306 may not be square, such as a rectangular geometric configuration, and the integrated circuit 304 may be mounted offset and not in a central region of the substrate 306.

The transparent encapsulation 302 also includes holes 320 exposing mounting interconnects 322 to the environment along a peripheral region of the substrate 306 and the transparent encapsulation 302. The mounting interconnects 322 are electrical connector structures that allow electrical connection to the integrated circuit packaging system 300 from the top side of the integrated circuit packaging system 300. Examples of the mounting interconnects 322 are solder balls, conductive posts, conductive columns, or electrical protrusion structures.

Figure 4:
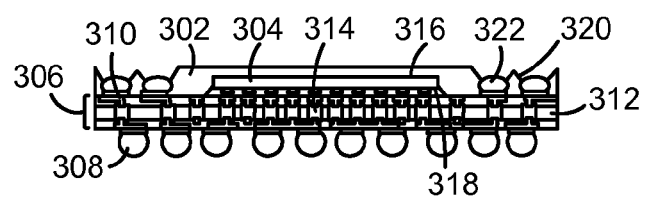
FIG. 4 is a cross-sectional view of the integrated circuit packaging system along line 4-4 of FIG. 3.

Referring now to FIG. 4, therein is shown a cross-sectional view of the integrated circuit packaging system 300 along line 4-4 of FIG. 3. External interconnects 308, which are electrical connector structures for providing electrical connections to the next system level (not shown), can be attached to a bottom of the substrate 306.

The substrate 306 can include contacts 310 and redistribution lines 312 along both horizontal sides of the substrate 306. The contacts 310 provide mechanical and electrical attachment structures to the substrate 306. For example, the external interconnects 308 can attach to the substrate 306 through the contacts 310 at the bottom side of the substrate 306.

The redistribution lines 312 provide conductive connections or traces for the substrate 306. The redistribution lines 312 can be along the horizontal sides of the substrate 306 and can also be within the substrate 306 providing horizontal electrical conduction paths. The redistribution lines 312 can also connect directly to the contacts 310.

The substrate 306 can also include vias 314. The vias 314 are electrical conduction channels that are vertically oriented in the substrate 306. The vias 314 can connect to the contacts 310, the redistribution lines 312, or a combination thereof.

The integrated circuit 304 is an active device having a non-active side 316 and an active side 318 having active circuitry fabricated thereon. As an example, the integrated circuit 304 is shown as a flip chip. The integrated circuit 304 can be other types of active devices, such as wire bonded integrated circuit, a packaged integrated circuit, or a multi-chip package. The integrated circuit 304 is mounted on the substrate 306, as an example.

The mounting interconnects 322 can also be mounted on the substrate 306 on the same side as the integrated circuit 304. The mounting interconnects 322 can be attached to the contacts 310.

The transparent encapsulation 302 is over the substrate 306 covering the integrated circuit 304 and the contacts 310 and the redistribution lines 312 along the top side of the substrate 306, as an example. As discussed above, the transparent encapsulation 302 allows the structure of the integrated circuit 304, the contacts 310, the redistribution lines 312, and the substrate 306 to be visible with visible light through the transparent encapsulation 302.

The transparent encapsulation 302 can also include the holes 320 to expose the mounting interconnects 322 to the environment. As an example, the holes 320 are shown having slanted sidewalls that are not completely horizontal or vertical but at an obtuse angle relative to the substrate 306. Also as an example, the heights of the mounting interconnects 322 are shown below the height of the transparent encapsulation 302 where both heights are measured from the substrate 306 to the furthest point of the structure being measured from the substrate 306. The holes 320 can also expose the contacts 310 when the mounting interconnects 322 are not used.

It has been discovered that the present invention provides the integrated circuit packaging system 300 with improved reliability, improved yield, and lower cost. The transparent encapsulation 302 allows the manufacturing equipment to recognize the location of the mounting interconnects 322 through the transparent encapsulation 302 allowing for accurate alignment over the mounting interconnects 322 to create the holes 320 to expose the mounting interconnects 322. The transparent property of the transparent encapsulation 302 allows for accurate alignment for accurate placement of the holes 320 thereby improving the reliability of the integrated circuit packaging system 300 to ensure the transparent encapsulation 302 still provides mechanical support of the mounting interconnects 322. The improved reliability increases yield and thereby lowers overall cost.

Figure 5:
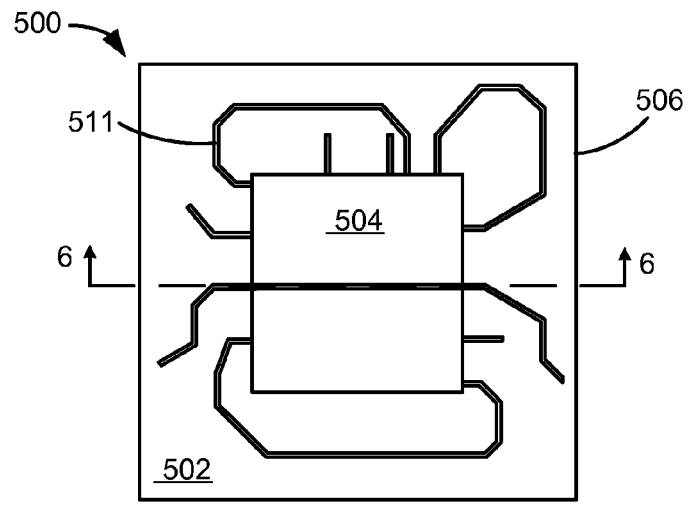
FIG. 5 is a top view of an integrated circuit packaging system in a third embodiment of the present invention.

Referring now to FIG. 5, therein is shown a top view of an integrated circuit packaging system 500 in a third embodiment of the present invention. FIG. 5 depicts a top view and not a top plan view where a transparent encapsulation 502 is shown exposing an integrated circuit 504 mounted to a substrate 506.

The top view also depicts conductive lines 511 on the transparent encapsulation 502. The conductive lines 511 are redistribution electrical lines for electrical conduction pathways. The conductive lines 511 can be used to electrical conduction internal to the integrated circuit packaging system 500 or also be used for providing electrical conduction for external connectivity to the integrated circuit packaging system 500. The conductive lines 511 are also redistribution lines.

The transparent encapsulation 502 is not an opaque encapsulation, such as an epoxy molding compound, and has light transmittance over a range of visible light. More details are about the light transmittance is described in FIG. 13 below.

The substrate 506 is an integrated circuit carrier made from lamination process, or a semiconductor or silicon fabrication process. Examples of the substrate 506 are laminated substrate or through-silicon-via substrate. A through-silicon-via substrate is one that is made from a wafer, such as a silicon wafer, and has redistribution layers on either or both horizontal surfaces and conductive vias through the silicon bulk material of the through-silicon-via substrate.

For illustrative purposes, the integrated circuit packaging system 500 is shown in a square geometric configuration, although it is understood that the configuration may be different. For example, the substrate 506 may not be square, such as a rectangular geometric configuration, and the integrated circuit 504 may be mounted offset and not in a central region of the substrate 506.

Figure 6:
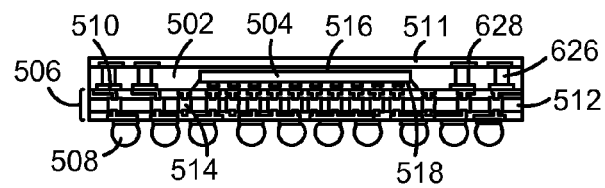
FIG. 6 is a cross-sectional view of the integrated circuit packaging system along line 6-6 of FIG. 5.

Referring now to FIG. 6, therein is shown a cross-sectional view of the integrated circuit packaging system 500 along line 6-6 of FIG. 5. External interconnects 508, which are electrical connector structures for providing electrical connections to the next system level (not shown), can be attached to a bottom of the substrate 506.

The substrate 506 can include contacts 510 and redistribution lines 512 along both horizontal sides of the substrate 506. The contacts 510 provide mechanical and electrical attachment structures to the substrate 506. For example, the external interconnects 508 can attach to the substrate 506 through the contacts 510 at the bottom side of the substrate 506.

The redistribution lines 512 provide conductive connections or traces for the substrate 506. The redistribution lines 512 can be along the horizontal sides of the substrate 506 and can also be within the substrate 506 providing horizontal electrical conduction paths. The redistribution lines 512 can also connect directly to the contacts 510.

The substrate 506 can also include vias 514. The vias 514 are electrical conduction channels that are vertically oriented in the substrate 506. The vias 514 can connect to the contacts 510, the redistribution lines 512, or a combination thereof.

The integrated circuit 504 is an active device having a non-active side 516 and an active side 518 having active circuitry fabricated thereon. As an example, the integrated circuit 504 is shown as a flip chip. The integrated circuit 504 can be other types of active devices, such as wire bonded integrated circuit, a packaged integrated circuit, or a multi-chip package. The integrated circuit 504 is mounted on the substrate 506, as an example.

The transparent encapsulation 502 is over the substrate 506 covering the integrated circuit 504 and the contacts 510 and the redistribution lines 512 along the top side of the substrate 506, as an example. As discussed above, the transparent encapsulation 502 allows the structure of the integrated circuit 504, the contacts 510, the redistribution lines 512, and the substrate 506 to be visible with visible light through the transparent encapsulation 502.

The transparent encapsulation 502 can also include conductive channels 626 connecting the substrate 506 and the conductive lines 511. As more specific examples, the conductive channels 626 can attach between the redistribution lines 512 or the contacts 510 and the conductive lines 511. Also as a specific example, the conductive lines 511 can be attached to terminals 628 and the terminals 628 attach to the conductive channels 626. The terminals 628 are electrical connection areas to the conductive lines 511. The conductive lines 511 can be formed over or on the terminals 628, the transparent encapsulation 502, or a combination thereof.

It has been discovered that the present invention provides the integrated circuit packaging system 500 with improved reliability, improved yield, and lower cost. The transparent encapsulation 502 allows the manufacturing equipment to recognize the location of the contacts 510 and redistribution lines 512 through the transparent encapsulation 502 allowing for accurate alignment over the contacts 510 and the redistribution lines 512 to create the conductive channels 626 and the terminals 628. The transparent property of the transparent encapsulation 502 allows for accurate alignment for accurate placement of the conductive channels 626, the terminals 628, and the conductive lines 511 thereby improving the reliability of the integrated circuit packaging system 500. The improved reliability increases yield and thereby lowers overall cost.

It has also been discovered that the present invention provides the integrated circuit packaging system 500 with increased flexibility for mounting other devices thereon. The transparent encapsulation 502 also improves the flexibility of choosing mounting other devices onto the integrated circuit packaging system 500 because the terminals 628 can be placed for mounting the other devices and the conductive lines 511 can be placed to map the appropriate electrical connections between the mounting device and the integrated circuit packaging system 500. The transparency of the transparent encapsulation 502 allows for routing the conductive lines 511 to the appropriate connections of the substrate 506, the contacts 510, and the redistribution lines 512.

Figure 7:
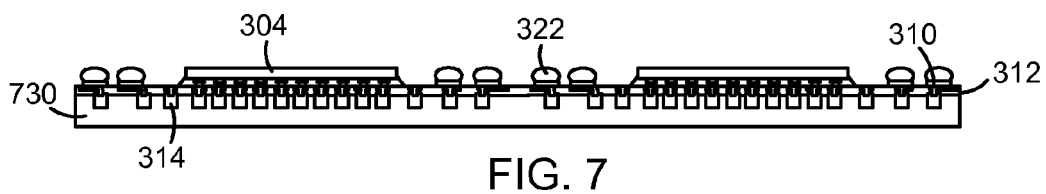
FIG. 7 is the integrated circuit packaging system of FIG. 4 in an attaching phase of the integrated circuit.

Referring now to FIG. 7, therein is shown the integrated circuit packaging system 300 of FIG. 4 in an attaching phase of the integrated circuit 304. In this phase, the substrate 306 of FIG. 4 is being formed. The vias 314 have been formed in a bulk 730, which is the material of the substrate 306. The vias 314 can be formed with patterning process for creating the holes in the bulk 730 and the holes filled with conductive materials.

The contacts 310 and the redistribution lines 312 have formed on a top side of the bulk 730. The contacts 310 can be formed by plating copper, for example, on to the vias 314. The contacts 310 can also be formed by a patterning process. The redistribution lines 312 can be formed from a patterning process and deposition on the contacts 310, the bulk 730, or a combination thereof.

The integrated circuit 304 can be attached to the substrate 306 through the contacts 310, the redistribution lines 312, or a combination thereof. The mounting interconnects 322 can be also attached to the substrate 306 through the contacts 310, the redistribution lines 312, or a combination thereof.

Figure 8:
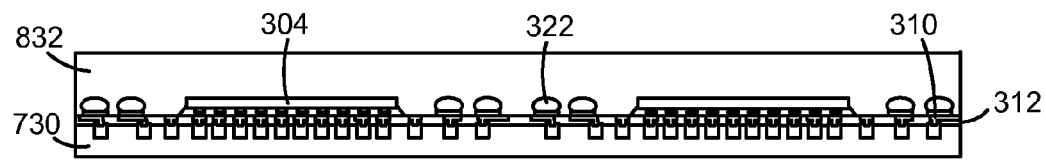
FIG. 8 is the structure of FIG. 7 in a molding phase of a transparent cover.

Referring now to FIG. 8, therein is shown the structure of FIG. 7 in a molding phase of a transparent cover 832. The transparent cover 832 is formed of the same material as the transparent encapsulation 302 of FIG. 4 and can be formed over the bulk 730 covering the integrated circuit 304 the contacts 310, the redistribution lines 312, the mounting interconnects 322, or a combination thereof.

The transparent cover 832 can be formed by a molding process, which can include injection molding, compression molding, reaction injection molding (RIM), transfer molding, extrusion molding, or a laminate method. The transparent encapsulation 302 can be formed in a suitable package configuration.

Optionally, the transparent cover 832 can also be formed bottom side of the bulk 730 to protect the structure from handling and subsequent process during the manufacturing process. The formation of the transparent cover 832 can be formed in any step and not necessarily the same step as forming the transparent cover 832 over the integrated circuit 304.

Figure 9:
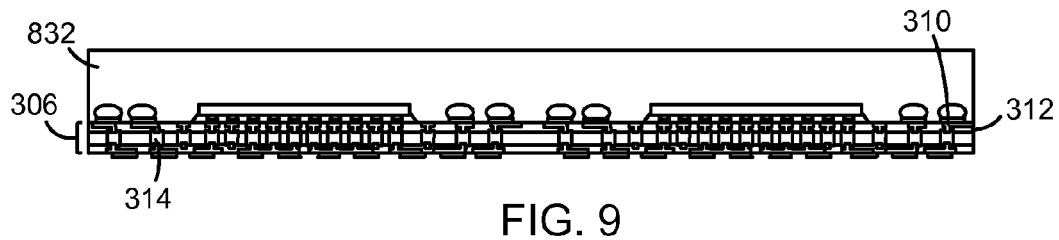
FIG. 9 is the structure of FIG. 8 in forming the substrate.

Referring now to FIG. 9, therein is shown the structure of FIG. 8 in forming the substrate 306. The structure of FIG. 8 can undergo a removal process, such as backgrinding the wafer, to remove a bottom portion of the bulk 730 of FIG. 8. The removal process can expose the vias 314. The contacts 310, the redistribution lines 312, or a combination thereof can be formed in the remaining portion of the bulk 730, the vias 314, or a combination thereof thereby forming the structure of the substrate 306 prior to singulation. The contacts 310 and the redistribution lines 312 can be formed with the same processes as described in FIG. 7. The transparent cover 832 is shown on the other side of the substrate 306.

Figure 10:
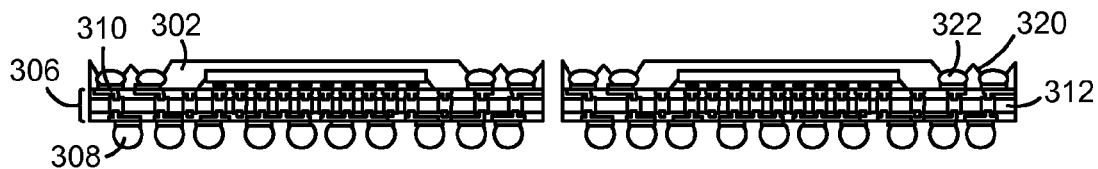
FIG. 10 is the structure of FIG. 9 in a singulating phase of the integrated circuit packaging system of FIG. 4.

Referring now to FIG. 10, therein is shown the structure of FIG. 9 in a singulating phase of the integrated circuit packaging system 300 of FIG. 4. The structure of FIG. 9 can undergo a removal process, such as a grinding process, of a portion of the transparent cover 832 of FIG. 9.

The holes 320 in the remaining portion of the transparent cover 832 can be formed by laser drilling thereby forming the transparent encapsulation 302 in non-singulated form. A laser drilling system (not shown) can align the laser drill over the mounting interconnects 322 with optical inspection through the remaining portion of the transparent cover 832 without any alignment marks thereon.

The holes 320 can expose the mounting interconnects 322 to the environment. The external interconnects 308 can be formed to the bottom side of the substrate 306 and attached to the contacts 310, the redistribution lines 312, or a combination thereof.

The structure can undergo a singulation process resulting in the formation of the integrated circuit packaging system 300. The transparent property of the transparent encapsulation 302 allows the singulation system to recognize singulation lines or scribe lines (not shown) through the transparent encapsulation 302 without any alignment marks on the transparent encapsulation 302.

Figure 11:
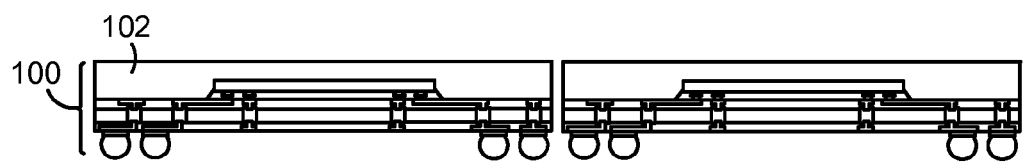
FIG. 11 is the integrated circuit packaging system of FIG. 2 in a singulating phase.

Referring now to FIG. 11, therein is shown the integrated circuit packaging system 100 of FIG. 2 in a singulating phase. The structure of FIG. 11 can be formed in a similar process as described from FIG. 7 through FIG. 10 for the appropriate structures for this embodiment. The structure is shown singulated forming the integrated circuit packaging system 100. As described in FIG. 10, the transparent property of the transparent encapsulation 102 allows the singulation system to recognize singulation lines or scribe lines (not shown) through the transparent encapsulation 102 without any alignment marks on the transparent encapsulation 102.

Figure 12:
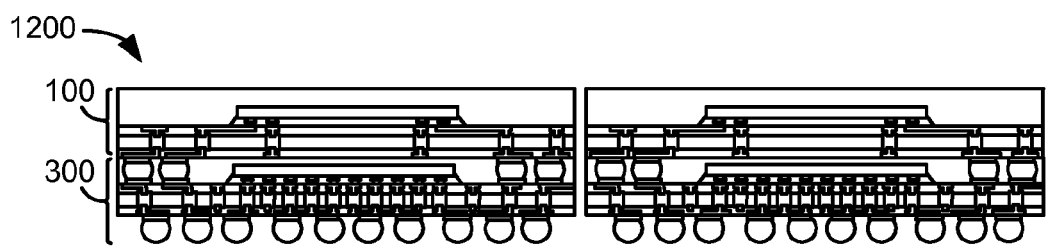
FIG. 12 is an integrated circuit packaging system in a fourth embodiment of the present invention.

Referring now to FIG. 12, therein is shown an integrated circuit packaging system 1200 in a fourth embodiment of the present invention. In this example of the present invention, the integrated circuit packaging system 1200 is shown as a package-on-package (PoP) integrated circuit packaging system with the integrated circuit packaging system 100 mounted over the integrated circuit packaging system 300.

Figure 13:
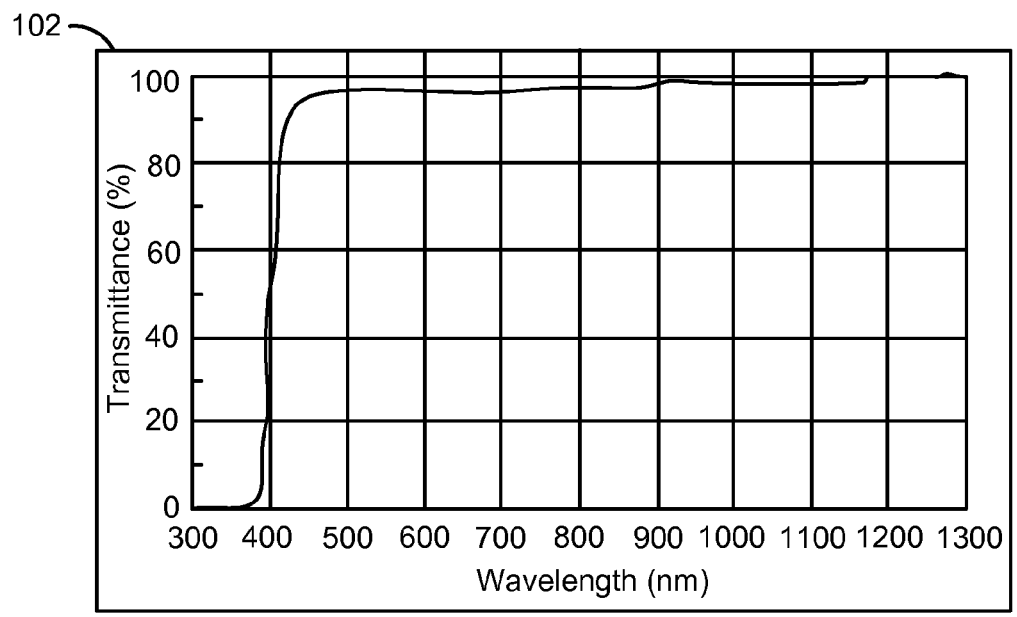
FIG. 13 is a graph for the transmittance property of the transparent encapsulation.

Referring now to FIG. 13, therein is shown a graph for the transmittance property of the transparent encapsulation 102. This graph represents the properties for the transparent encapsulation 102 in all the embodiments described above.

A total light transmittance for the transparent encapsulation 102 should be more than 80% in the visible light range (from 450 nm to 800 nm) for accurate wafer alignment. The graph in this figure is an example of transparent molding compound of the transparent encapsulation 102, which can be used for light emitting diode (LED) wafer-level molding application.

As depicted by the graph, the transmittance (shown in the y-axis) is over 95% around 450 nanometer (nm) wavelength light (depicted on the x-axis) and over 95% and nearly 100% through the wavelength of 1300 nanometer (nm).

The transparent molding compound for the transparent encapsulation 102 can include nano-size fillers. As specific examples, transparent molding compound is easy to handle and maintain because of its compound type (transfer molding), while other liquid molding compounds require more attention for handling and storing because of the compound characteristics. The transparent molding compound can be more cost-effective than liquid molding compound, taken as whole including the elimination of alignment markings described above and the improved reliability and yield.

The transparent molding compound has low coefficient of thermal expansion (CTE). This is important because CTE mismatch between a wafer and the molding material can lead to cracking of wafers during the cooling process. The filler loading as percentage weight can be 30% to 50%. The CTE (ppm) for 30% filler loading is between 52 and 142 parts per million per degree Celsius (ppm/° C.) and for 50% filler loading is between 43 and 125 ppm/° C. The modulus of the transparent molding compound at 30% filler loading is approximately between 2.6 GPa at 30 C to 63 MPa at 200 C and at 50% filler loading is approximately between 2.7 GPa at 30 C and 110 MPa at 200 C.

Figure 14:
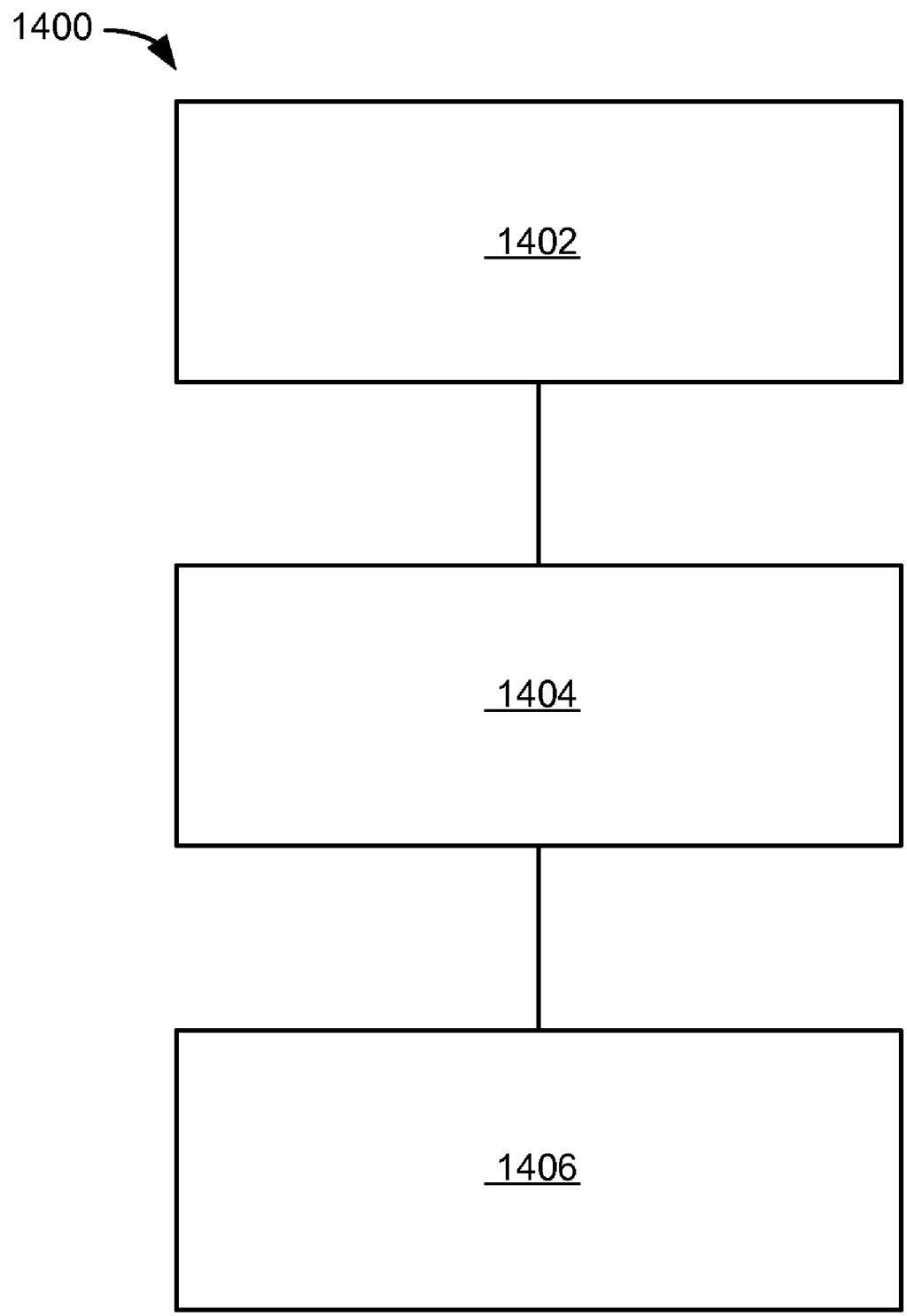
FIG. 14 is a flow chart of a method of manufacture of the integrated circuit packaging system in a further embodiment of the present invention.

Referring now to FIG. 14, therein is shown a flow chart of a method 1400 of manufacture of the integrated circuit packaging system 100 in a further embodiment of the present invention. The method 1400 includes: forming a substrate having a redistribution line thereon in a block 1402; mounting an integrated circuit to the substrate in a block 1404; and molding a transparent encapsulation over the substrate covering the integrated circuit and the redistribution line and the integrated circuit seen through the transparent encapsulation in a block 1406.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
    forming a substrate having a redistribution line thereon;
    mounting an integrated circuit to the substrate;
    forming a mounting interconnect on the substrate;
    molding a transparent encapsulation over the substrate covering the integrated circuit and the redistribution line and the integrated circuit seen through the transparent encapsulation; and
    forming a hole in the transparent encapsulation to the mounting interconnect.

2. The method as claimed in claim 1 further comprising forming a conductive channel through the transparent encapsulation to the substrate.

3. The method as claimed in claim 1 wherein forming the substrate includes forming a through-silicon-via substrate.

4. The method as claimed in claim 1 further comprising forming a conductive line on the transparent encapsulation.

5. A method of manufacture of an integrated circuit packaging system comprising:
    forming a substrate having a redistribution line thereon;
    mounting an integrated circuit to the substrate;
    forming a mounting interconnect on the substrate;
    molding a transparent encapsulation over the substrate covering the integrated circuit and the redistribution line and the integrated circuit seen through the transparent encapsulation with the transparent encapsulation having a transmittance of over 95% of light with a wavelength between 450 nm and 1300 nm; and
    forming a hole in the transparent encapsulation to the mounting interconnect.

6. The method as claimed in claim 5 further comprising:
    forming a mounting interconnect on the substrate;
    aligning a location for a hole over the mounting interconnect through the transparent encapsulation; and
    forming the hole in the transparent encapsulation at the location.

7. The method as claimed in claim 5 further comprising:
    forming a conductive channel through the transparent encapsulation to the substrate; and
    forming a conductive line on the transparent encapsulation and to the conductive channel.

8. The method as claimed in claim 5 wherein:
    forming the substrate includes forming a contact on the substrate; and further comprising:
    aligning a location for a conductive channel to the contact through the transparent encapsulation; and forming the conductive channel through the transparent encapsulation at the location.

9. The method as claimed in claim 5 wherein molding the transparent encapsulation includes forming the transparent encapsulation having a coefficient of thermal expansion approximately between 43 ppm/° C. and 142 ppm/° C.

10. An integrated circuit packaging system comprising:
a substrate having a redistribution line thereon;
an integrated circuit mounted to the substrate;
a mounting interconnect on the substrate;
a transparent encapsulation over the substrate covering the integrated circuit and the redistribution line and the integrated circuit seen through the transparent encapsulation; and
a hole in the transparent encapsulation to the mounting interconnect.

11. The system as claimed in claim 10 further comprising a conductive channel through the transparent encapsulation to the substrate.

12. The system as claimed in claim 10 wherein the substrate includes a through-silicon-via substrate.

13. The system as claimed in claim 10 further comprising forming a conductive line on the transparent encapsulation.

14. The system as claimed in claim 10 wherein the transparent encapsulation has a transmittance of over 95% of light with a wavelength between 450 nm and 1300 nm.

15. The system as claimed in claim 14 further comprising:
a mounting interconnect on the substrate; and wherein:
the transparent encapsulation includes a hole aligned to the mounting interconnect and exposes the mounting interconnect.

16. The system as claimed in claim 14 further comprising:
a conductive channel through the transparent encapsulation to the substrate; and
a conductive line on the transparent encapsulation and to the conductive channel.

17. The system as claimed in claim 14 wherein:
the substrate includes a contact; and further comprising:
a conductive channel through the transparent encapsulation to the contact.

18. The system as claimed in claim 14 wherein the transparent encapsulation has a coefficient of thermal expansion approximately between 43 ppm/° C. and 142 ppm/° C.

* * * * *